US006846194B2

(12) United States Patent
Self et al.

(10) Patent No.: US 6,846,194 B2
(45) Date of Patent: Jan. 25, 2005

(54) CAM BUMPLETT APPARATUS AND SYSTEM

(75) Inventors: Bobby Joe Self, Colorado Springs, CO (US); Kevin Michael Hall, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 49 days.

(21) Appl. No.: 10/302,546

(22) Filed: Nov. 22, 2002

(65) Prior Publication Data

US 2004/0102073 A1 May 27, 2004

(51) Int. Cl.[7] .......................... H01R 13/62; H01R 11/22
(52) U.S. Cl. ...................................... 439/329; 439/267
(58) Field of Search .......................... 439/329, 67, 267, 439/260, 632

(56) References Cited

U.S. PATENT DOCUMENTS

| 4,116,517 A | * | 9/1978 | Selvin et al. ................. 439/67 |
| 5,661,901 A | * | 9/1997 | King ............................ 29/830 |
| 5,913,699 A | * | 6/1999 | Zielke ......................... 439/632 |
| 6,410,859 B1 | * | 6/2002 | King ........................... 174/260 |

* cited by examiner

Primary Examiner—Chandrika Prasad

(57) ABSTRACT

A system includes an interconnect that is seated and retained in a connector using a number of bumpletts arranged in the system to exert a cam force that encourages retention of the interconnect in the connector. The connector is coupled to a target board. The connector comprises a spacer nest and a pair of boards, such as printed circuit boards, that may contain electrical circuitry. The cam bumpletts may reside at the interconnect, or on either or both of the pair of boards of the connector.

37 Claims, 21 Drawing Sheets

CAM BUMPLETT APPARATUS AND SYSTEM

FIELD OF THE INVENTION

The invention relates to electrical connectors used to facilitate the connection of electrical signals between electrical circuit devices. In particular, the invention relates to a cam connector capable of engaging and retaining through application of a bumplett-induced camming force an interconnect inserted into it.

BACKGROUND OF THE INVENTION

It is often necessary, particularly in electrical test and measurement applications, to be able to make available the electrical signals of a particular electrical device, such as a printed circuit board, to another electrical device. In such applications, many test and measurement devices, including logic analysis systems and problems, require the use of a high density interconnect to interface with a device under test, such as a printed circuit board, via an electrical connector.

In the connection of electrical circuit devices, such as printed circuit boards, an interconnect that is seated in a connector with contacts molded to match the design of the connector is commonly used. Using this technique forces a designer to use standard off-the-shelf pre-configured molded connectors or to design and tool a customized molded connector. Use of standard off-the-shelf pre-configured molded connectors may not be customized since they are pre-configured to a certain specification and are thus not flexible. The design and tooling required to create a customized molded connector is thus both costly and time consuming. Moreover, a customized molded connector is not flexible, since each connector of a different size and/or specification would have to be designed and tooled. Because of the time and cost associated with a customized molded connection, it is not an efficient solution for low volume production where only a small number of connectors need to be created.

Also in test and measurement applications, it is desirable to locate electrical circuitry as close to the target being tested as possible, particularly when dealing with fast signals. In the testing of electrical devices, a termination network is commonly used to minimize reflections between the device under test (target) and the test and measurement device or probe interconnecting to the target. Since molded connectors do not allow electrical circuitry to be placed at the connection point of the connector contact area, there is no provision for having connector termination networks at the interface to the target, thereby causing the termination network to be located further away from the target than is preferable. In this configuration, the physical location of the termination network is important. The spacing of termination networks or circuitry away from the interconnect contact area can introduce unwanted parasitic electrical effects, particularly when measuring fast signals, which can have an adverse impact on accurate signal measurement. Thus, using molded connectors forces termination network circuitry or other needed electrical circuitry to be located further away from the target than is preferable.

Molded connectors additionally have several deficiencies because they are tooled. Using a tooling technique to create a molded connector prohibits creation of an extremely low profile molded connector which in turn increases the required overall profile size of an electrical device to which the connector is attached. Additionally, in molded connectors, the contacts are typically molded into the connector itself Over time, these contacts tend to oxidize and corrode which may affect the electrical performance of the electrical circuitry.

SUMMARY OF THE INVENTION

The invention includes a connector, having a nest spacer element, a substantially planar first board, and a substantially planar second board. The nest spacer element has a first substantially planar surface, a second substantially planar surface, and a recessed portion that is contiguous to the first and second substantially planar surfaces operable to accommodate an interconnect. The substantially planar first board has a first outer surface and a first inner surface coupled to the first substantially planar surface of the nest spacer element. The substantially planar second board has a second outer surface and a second inner surface coupled to the second substantially planar surface of the nest spacer element, with at least one of the first and second boards having a plurality of connector signal traces arranged along one or more of the corresponding inner and outer surfaces. The insertion of the interconnect into the recessed portion of the nest spacer element produces a camming force between the connector and the interconnect caused by a plurality of bumpletts located on the connector.

The invention further encompasses a connector system having an interconnect and a connector. The interconnect has a substantially planar surface and a plurality of interconnect signal traces that terminate at a coupling end of, the interconnect. The connector comprises a nest spacer element, a substantially planar first board, and a substantially planar second board. The nest spacer element has a first substantially planar surface, a second substantially planar surface, and a recessed portion that is contiguous to the first and second substantially planar surfaces operable to accommodate an interconnect. The substantially planar first board has a first outer surface and a first inner surface coupled to the first substantially planar surface of the nest spacer element. The substantially planar second board has a second outer surface and a second inner surface coupled to the second substantially planar surface of the nest spacer element, with at least one of the first and second boards having a plurality of connector signal traces arranged along one or more of the corresponding inner and outer surfaces. The insertion of the interconnect into the recessed portion of the nest spacer element produces a camming force between the connector and the interconnect caused by a plurality of bumpletts located on at least one of the interconnect, the first board, and the second board. The system can further encompass a target board to which the connector is coupled.

The invention can further include a cam connection system having an interconnect, a target board, and a connector housing. The interconnect has a plurality of interconnect signal traces that terminate at a coupling end of the interconnect. The target board has a plurality of target signal traces. The connector housing is coupled to the target board and has a portion operable to accommodate the interconnect parallel to the target board. The insertion of the coupling end of the interconnect into the connector housing produces a camming force between the connector housing, the target board, and the interconnect caused by a plurality of bumpletts located on at least one of the connector housing, the interconnect, and the target board thereby coupling the plurality of target signal traces to the plurality of interconnect signal traces.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
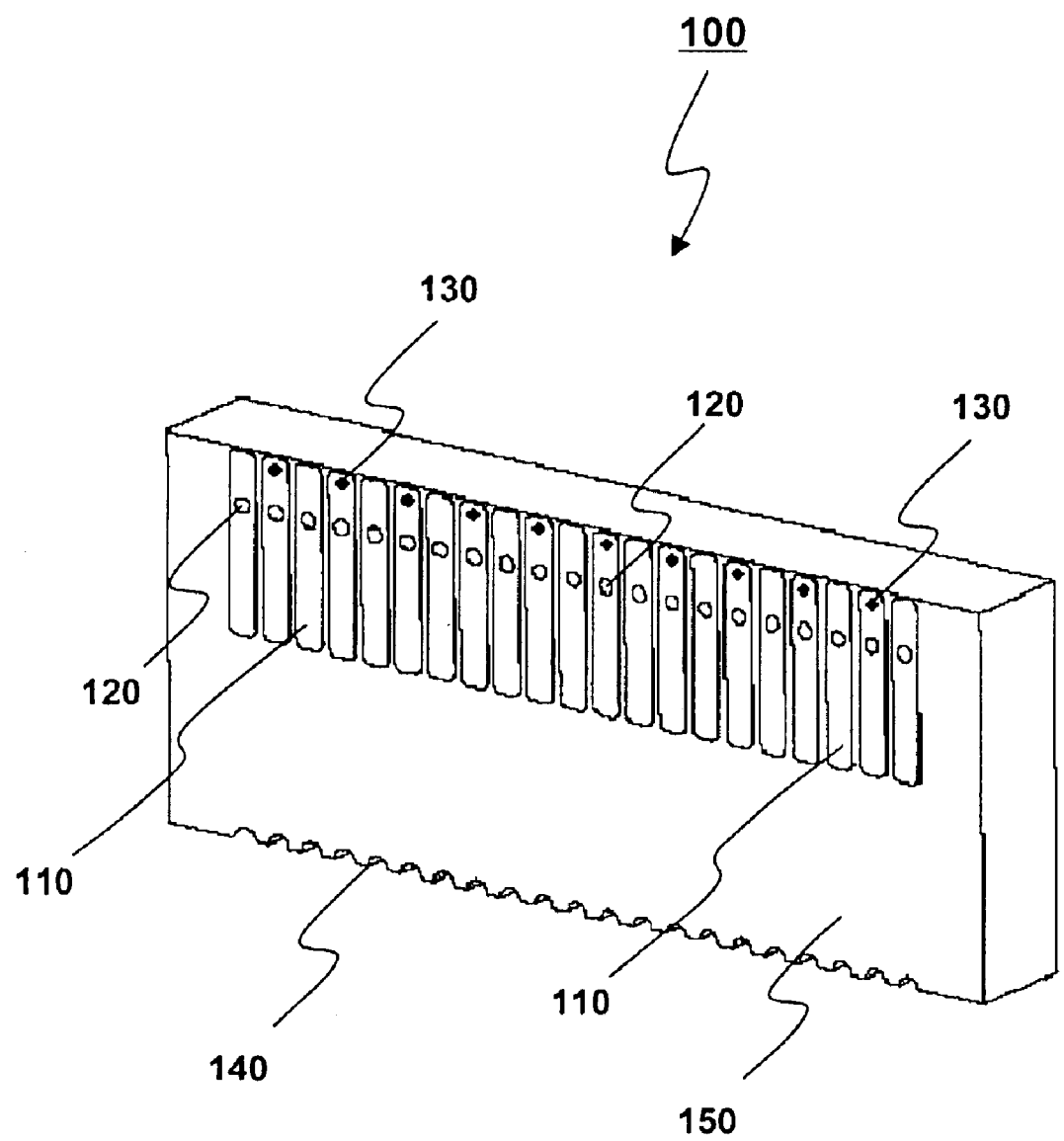
FIG. 1 is a perspective inside view of a substantially planar first board in accordance with certain embodiments of the invention.
Figure 2:
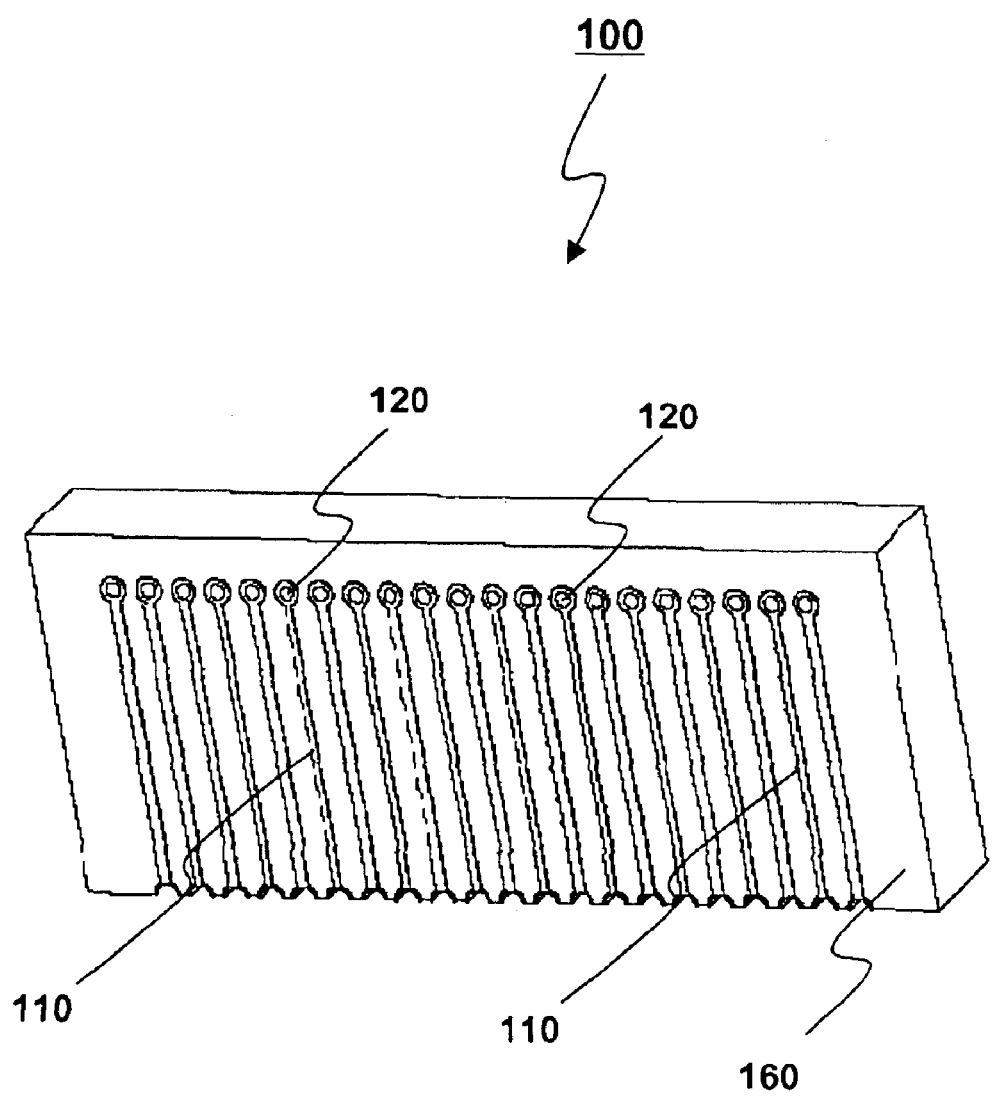
FIG. 2 is a perspective outside view of the substantially planar first board in accordance with certain embodiments of the invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several Views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Referring first to FIGS. 1, 2, 3 and 4, inner and outer perspective views of a substantially planar first board 100 and a substantially planar second board 200 in accordance with certain embodiments of the present invention are shown; the first and second boards 100 and 200, together with spacer nest 300, together form a connector as will be clear in the description of later figures. The substantially planar first board 100, such as a printed circuit board, has a first bottom surface 140, a first inner surface 150, and a first outer surface 160 as shown. The substantially planar second board 200, which may also be a printed circuit board, has a second bottom surface 240, a second inner surface 250, and a second outer surface 260 as shown. As used herein, reference to an "inner surface" refers to that surface of the board that faces towards the inside of the spacer nest 300 when attached to it, whereas reference to an "outer surface" refers to that surface of the board that faces towards the outside of the connector when the board is attached to the spacer nest. The boards are configured such that at least one of the first 100 and second 200 boards has a plurality of connector signal traces, 110 and 210 respectively, arranged along one or more of the inner and outer surfaces. An example of a board configuration without any signal traces is shown and described later in FIG. 21

The plurality of electrical traces, 110 and 210, on the first inner surface 150 and second inner surface 250 each have a via, 120 and 220, to provide electrical continuity of an electrical trace between the first outer surface 160 and the second outer surface 260 as shown. The plurality of electrical traces 110 and 210 each are suitable to be coupled to any nominal reference voltage level, of which ground is one example, if so desired, in addition to electrical signals. The electrical traces may be made of gold plated brass or other suitable electrical conductor material.

A plurality of bumpletts 130 and 230 are shown operably attached to one or more of the electrical traces 110 and 210 along the inside surfaces of the boards 100 and 200, respectively. As shown, these bumpletts need not be placed on every signal trace 110, 210. Placement of the bumpletts should simply support the generation of a camming force upon insertion of an interconnect into the recessed portion of the housing. Insertion of the interconnect will push the bumpletts against the signal traces, in a wiping motion, resulting in a camming force, similar to a spring-loaded force, that will assist in retaining the interconnect into the connector.

Figure 3:
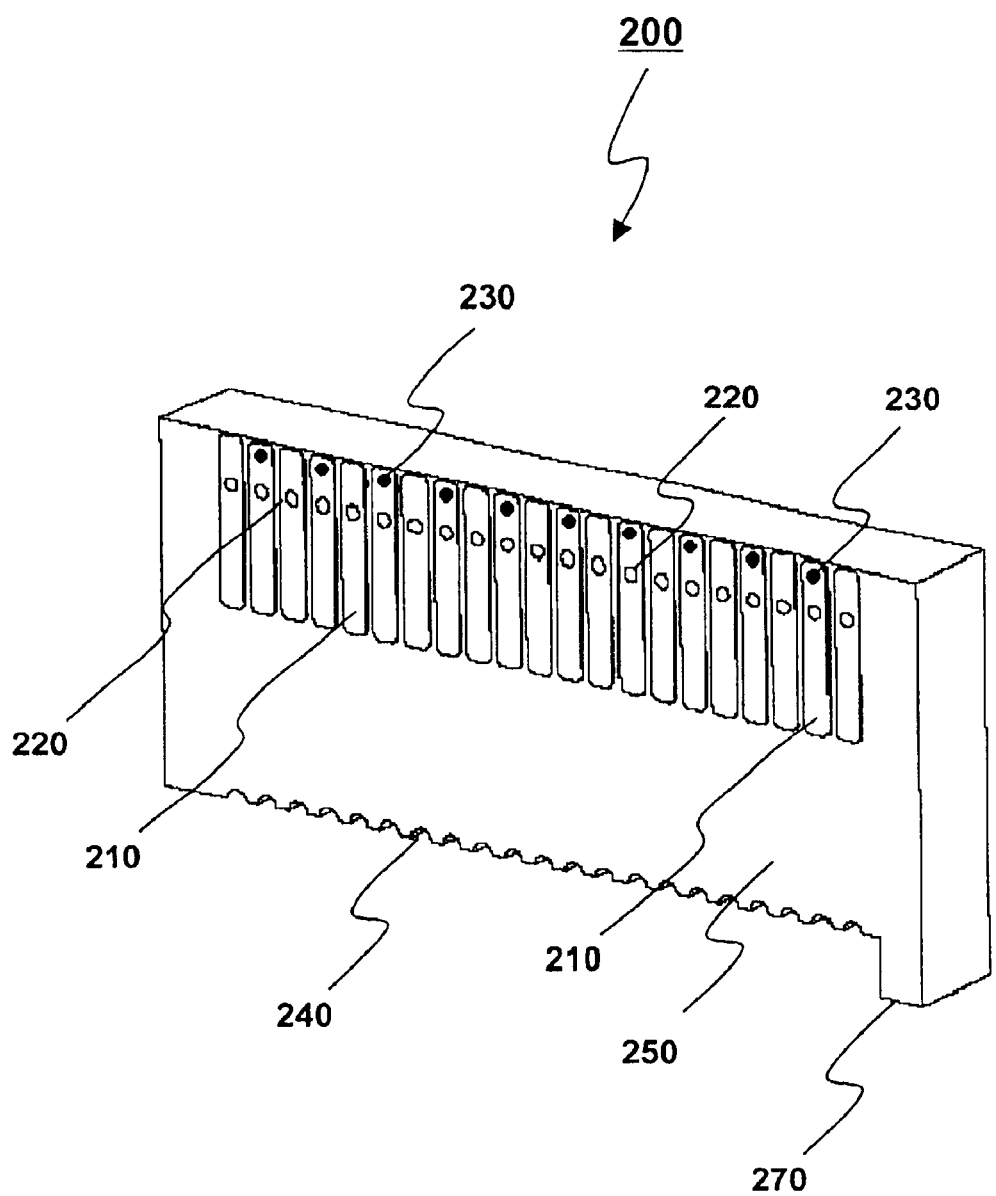
FIG. 3 is a perspective inside view of a substantially planar second board in accordance with certain embodiments of the invention.
Figure 4:
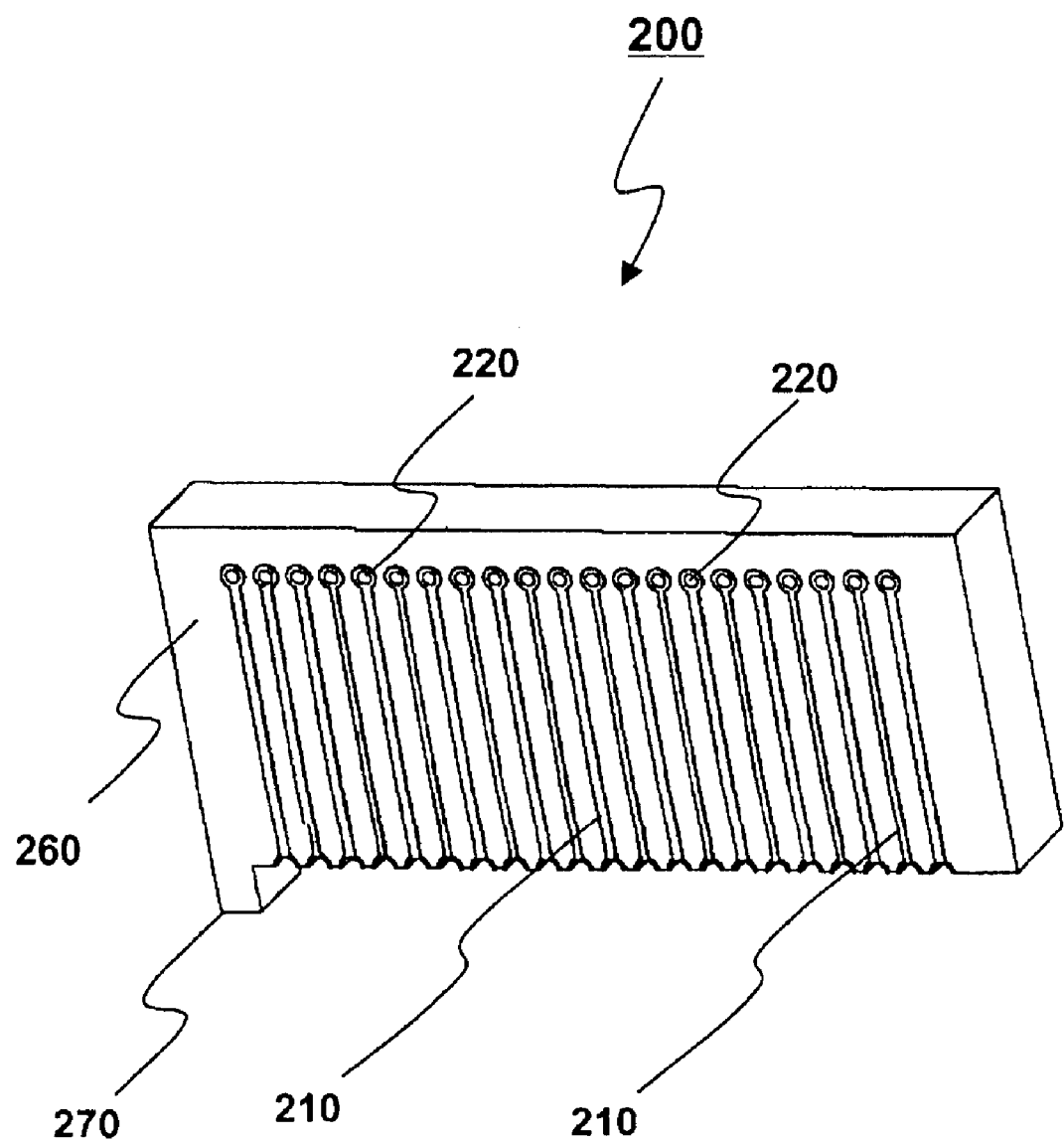
FIG. 4 is a perspective outside view of the substantially planar second board in accordance with certain embodiments of the invention.

FIGS. 3 and 4 show an optional keying element 270 extending vertically from the bottom surface 240 of the second board 200. This optional keying element operates to ensure the proper orientation of the assembled connector to a target board, as will be described.

Figure 5:
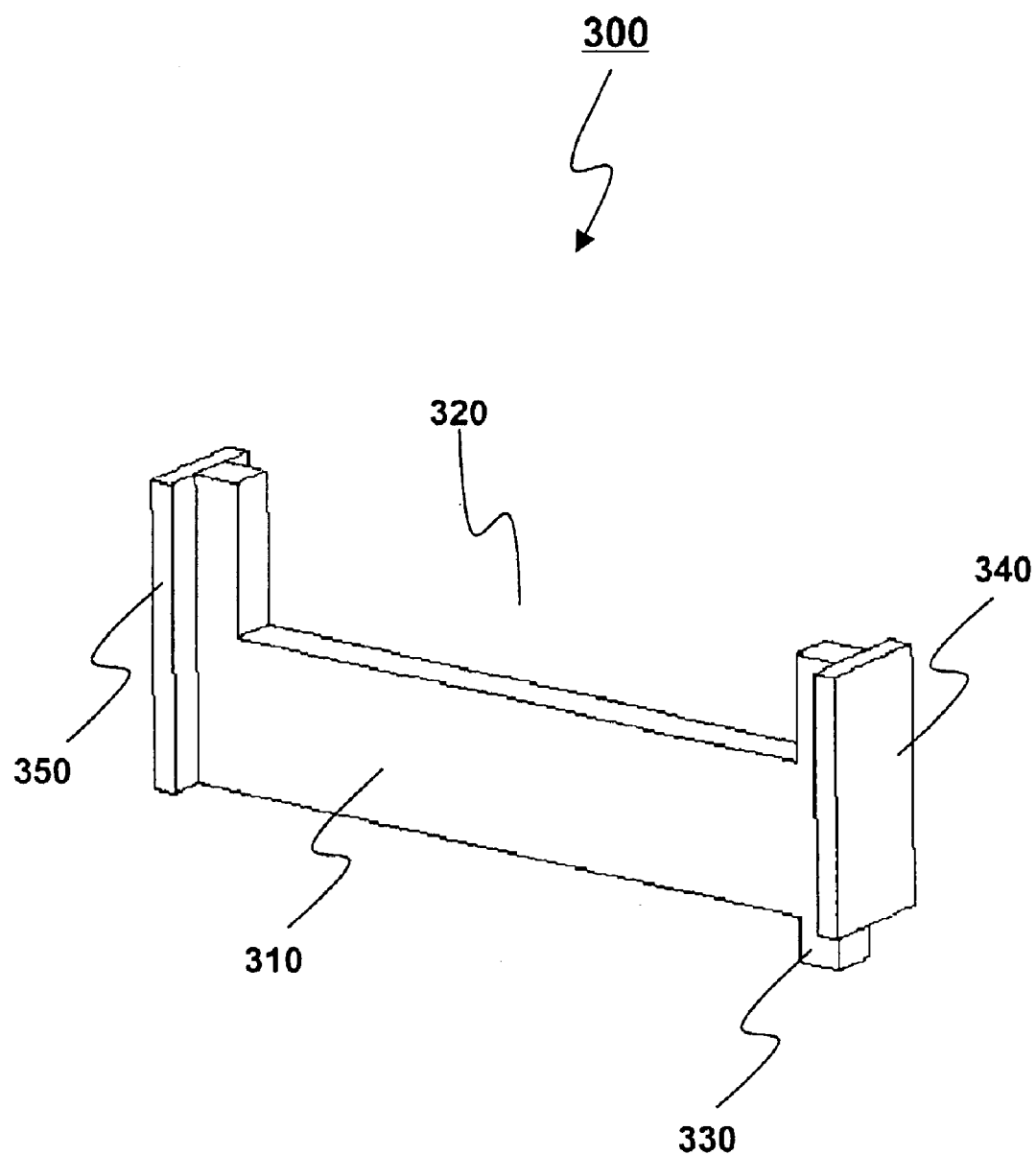
FIG. 5 is a perspective view of a spacer nest element in accordance with certain embodiments of the invention.
Figure 6:
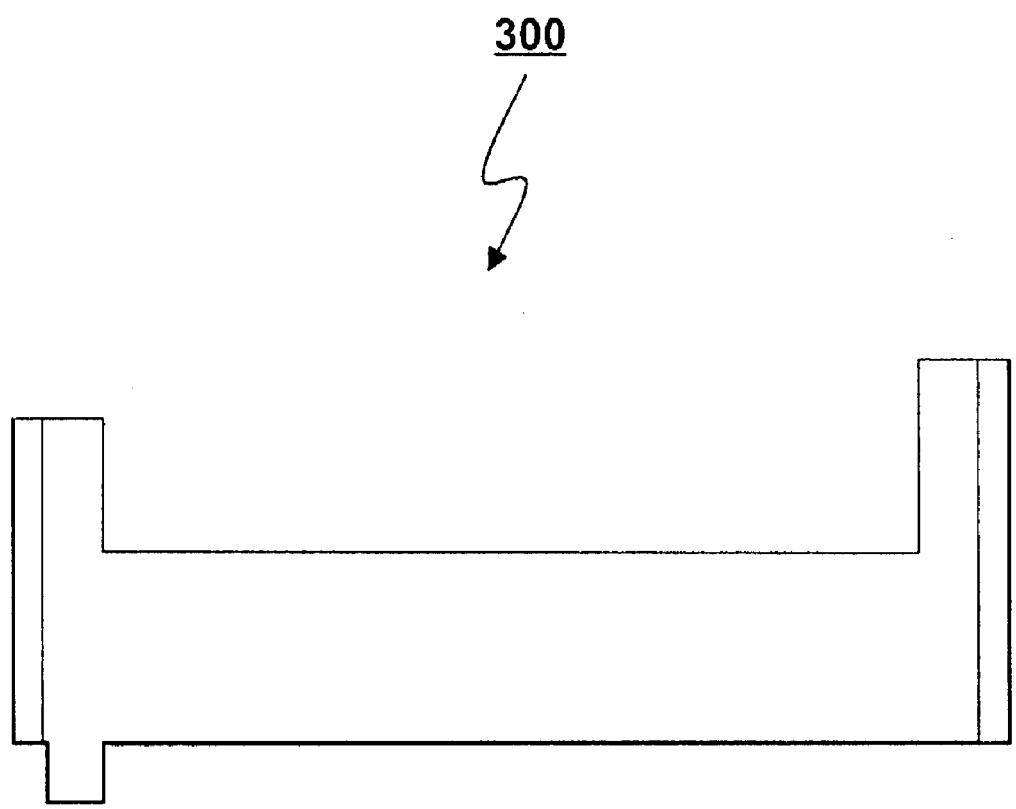
FIG. 6 is a front view of the spacer nest element in accordance with certain embodiments of the invention.
Figure 7:
FIG. 7 is a side view of the spacer nest element in accordance with certain embodiments of the invention.
Figure 7:
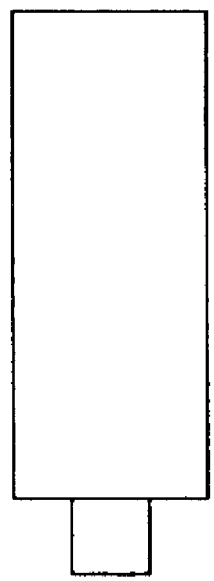
Figure 8:
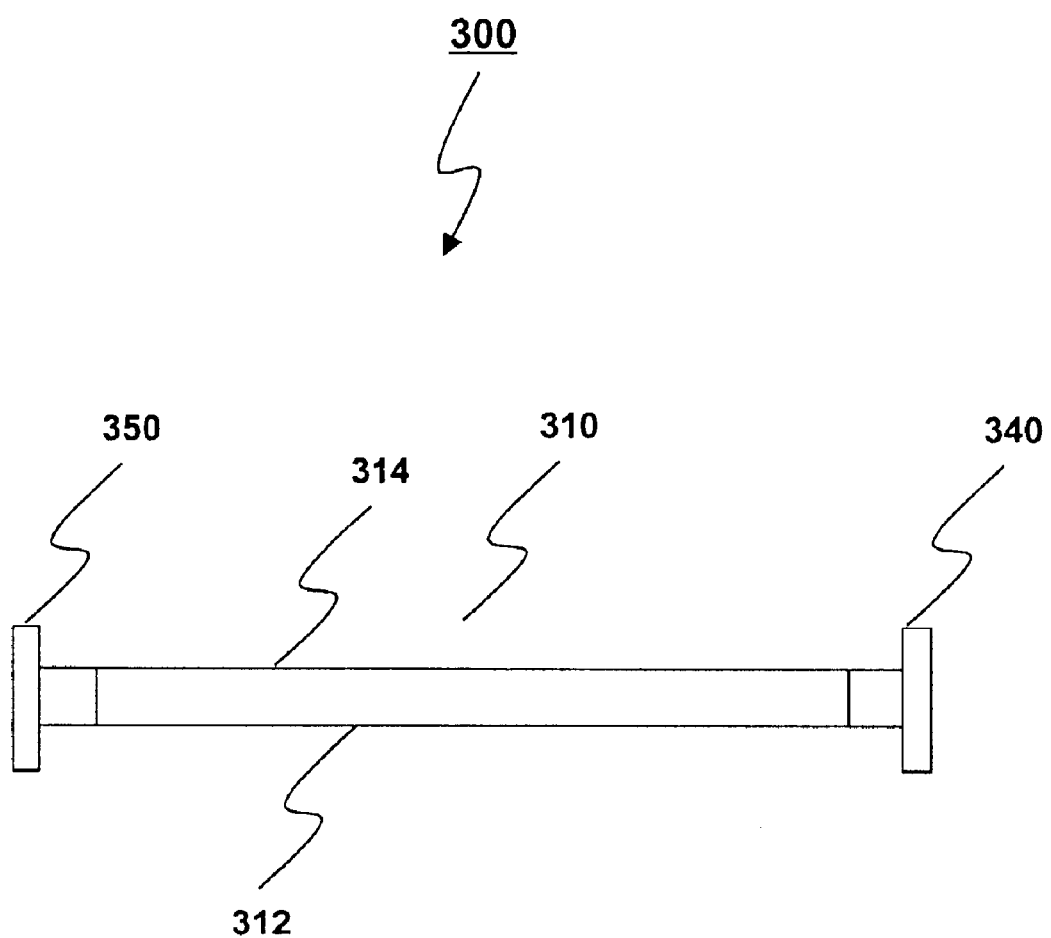
FIG. 8 is a top view of the spacer nest element in accordance with certain embodiments of the invention.

In the particular embodiments illustrated in FIGS. 1–4, it can be seen that along the inner surface of a board, the connector signal traces 110, 210 are aligned near the top of the inside surface of the board to be accessible to an interconnect that may be inserted into the recess 320 of the connector; the u-shaped middle portion 310 of spacer nest 300, shown in FIG. 5, argues for this placement of the signal traces along the inside surface of the board, although different configurations of the connector housing might suggest different placement of the signal lines. Similarly, the arrangement of the connector signals traces 110, 210 along most of the outer surface of the boards is but an example, although this arrangement does support the arrangement of one or more discrete electrical components or other circuitry along the outside of the connector, as will be described.

Referring to FIGS. 5, 6, 7, and 8, perspective, front, side, and top views, respectively, of a spacer nest element 300 in accordance with certain embodiments of the present invention are shown. The spacer nest element 300 has a middle portion 310 with a first substantially planar surface 312 and a second substantially planar surface 314. It can be seen that the middle portion 310 additionally may have a recessed portion 320, in this embodiment having a "U" shape, as shown. FIG. 5 shows an optional keying element 330, a first peripheral wall 340, and a second peripheral wall 350 of the spacer nest element 300. The keying element 330 is shown extending vertically from the bottom of the spacer nest element. The first and second peripheral walls 340 and 350 are coupled perpendicularly and coextensively to the middle portion 310 as shown.

Figure 9:
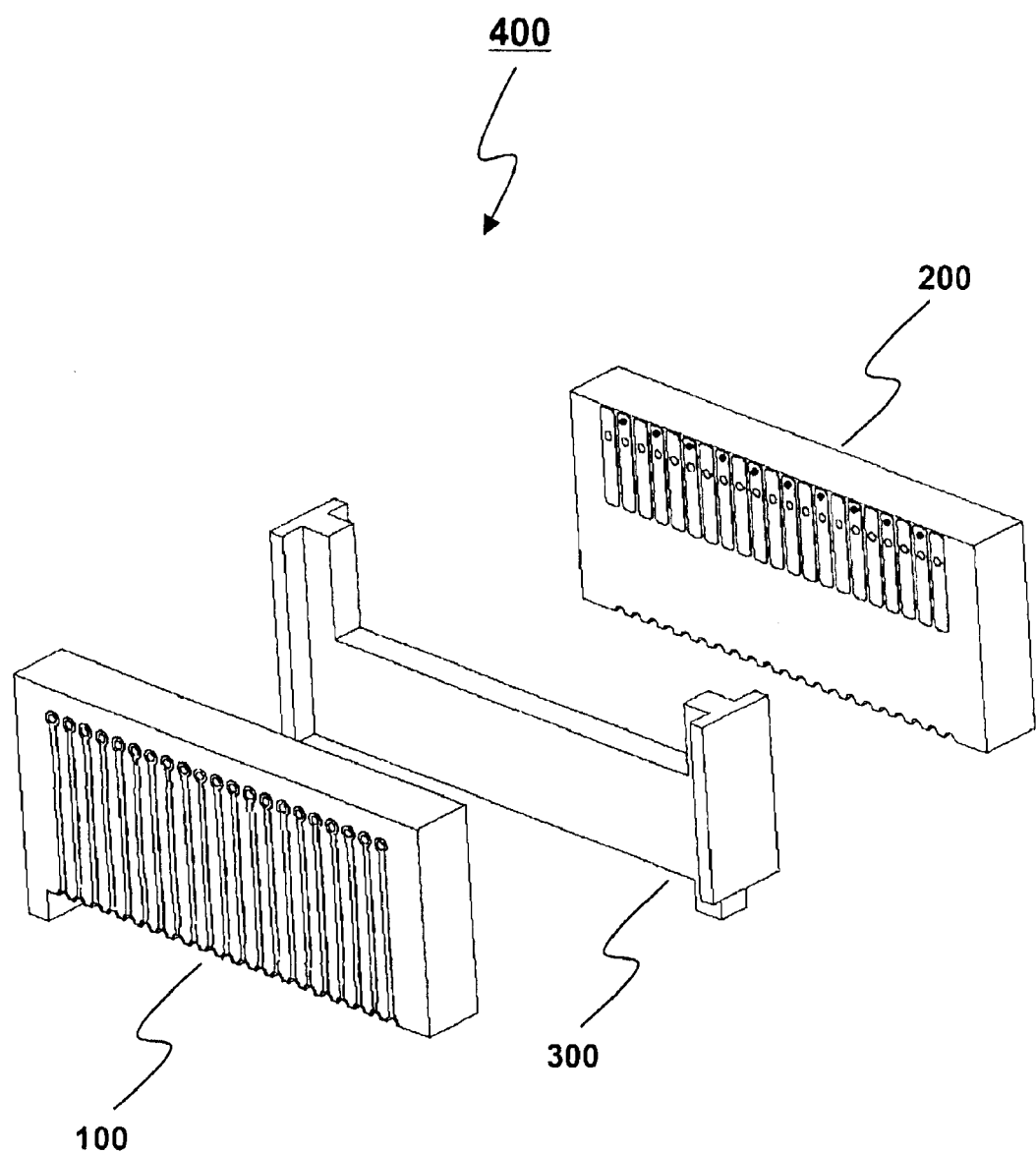
FIG. 9 is an exploded view of a connector in accordance with certain embodiments of the invention.

Referring to FIG. 9, an exploded view of a connector in accordance with certain embodiments of the present invention is shown. The connector 400 has a nest spacer element 300, a substantially planar first board 100, and a substantially planar second board 200 as shown. These parts of the connector have been previously described. FIG. 9 illustrates the alignment of these parts with respect to one another, particularly the alignment of the boards 100, 200 inside the peripheral walls previously discussed.

Figure 10:
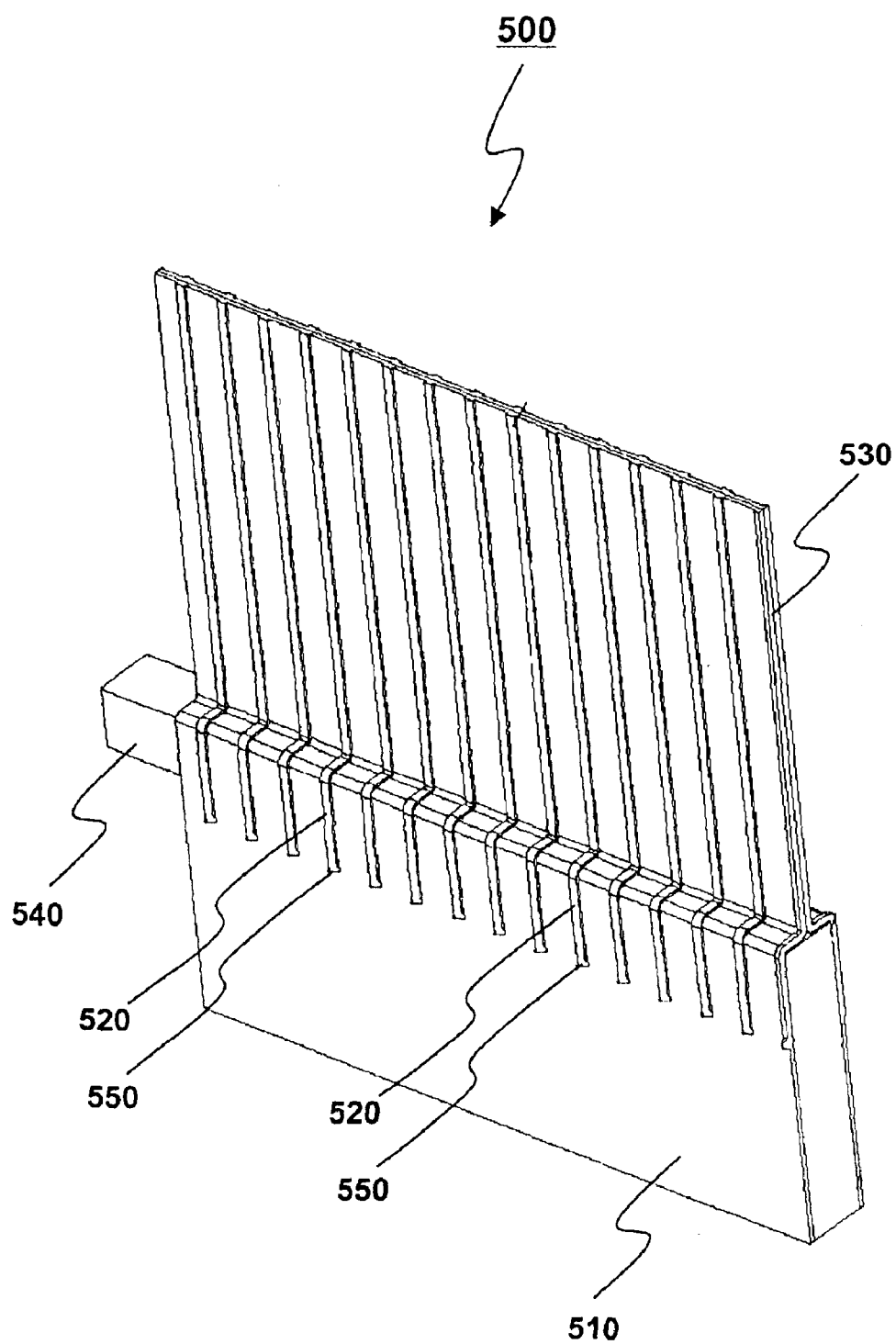
FIG. 10 is a perspective view of an interconnect in accordance with certain embodiments of the invention.

Referring to FIG. 10, a perspective view of an interconnect in accordance with certain embodiments of the invention is shown. The interconnect 500 has a substantially planar surface 510 and a plurality of interconnect signal traces 520 that terminate at a coupling end 550 of the interconnect as shown. A rigid flex circuit 530 is shown extending away from the coupling end 550 of the interconnect. One skilled in the art will appreciate, however, that the rigid flex circuit may be substituted for a printed circuit board, a cable, or any equivalent capable of carrying electrical signals. The interconnect may optionally contain a plurality of bumpletts shown and described later in FIGS. 14 and 15.

Figure 11:
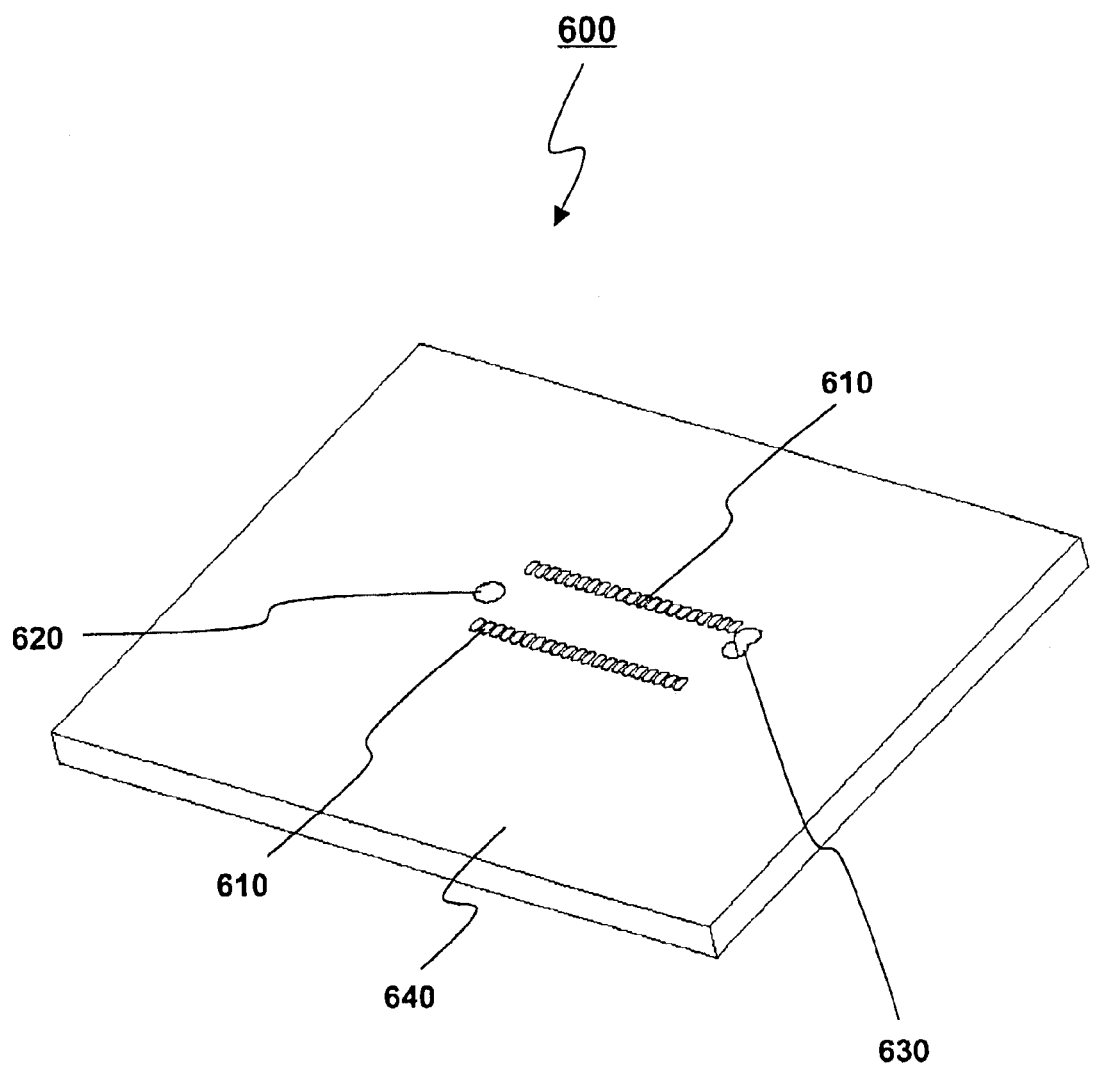
FIG. 11 is a perspective view of a target board in accordance with certain embodiments of the invention.

Referring to FIG. 11, a perspective view of a target board in accordance with certain embodiments of the invention is shown. The target board 600, which may also be referred to as a device under test, has a plurality of target signal traces 610 (not shown) that are coupled to the connector signal traces 110 and 210 shown previously in FIGS. 1, 2, 3 and 4 via a coupling means, such as reflowable solder bumps 610. Optionally, the target board 600 may contain a first key coupling 630 and a second key coupling 620, that is coupled to the optional keying element 330 of the nest spacer element 300 previously shown in FIGS. 5, 6, and 7 and the optional keying element 270 of the substantially planar second board 200, respectively. It is advisable, but not required, to use keying so that the connector 400 cannot be coupled incorrectly to the target board 600.

Figure 12:
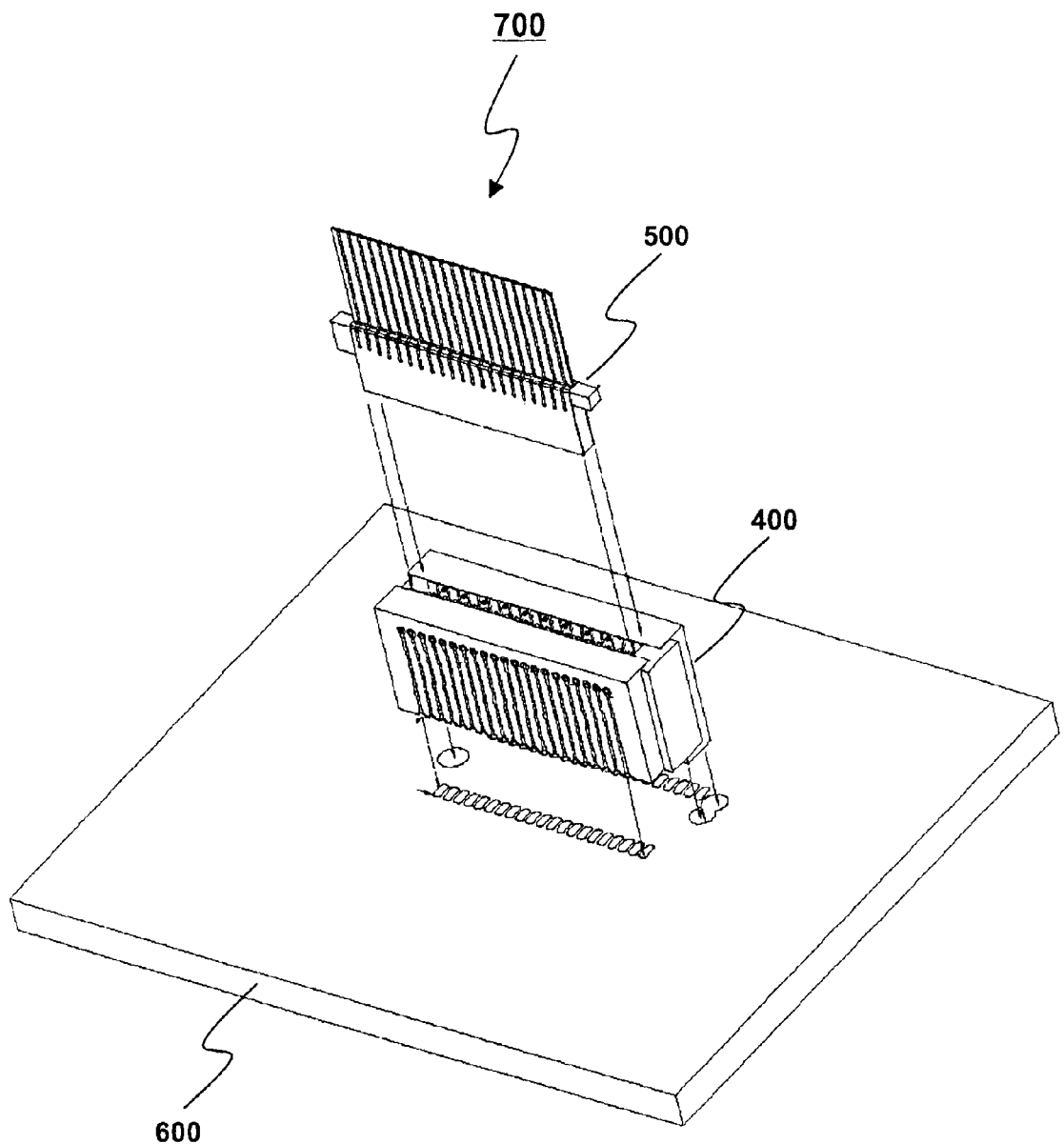
FIG. 12 is a perspective view of a cam connection system in accordance with certain embodiments of the invention.
Figure 13:
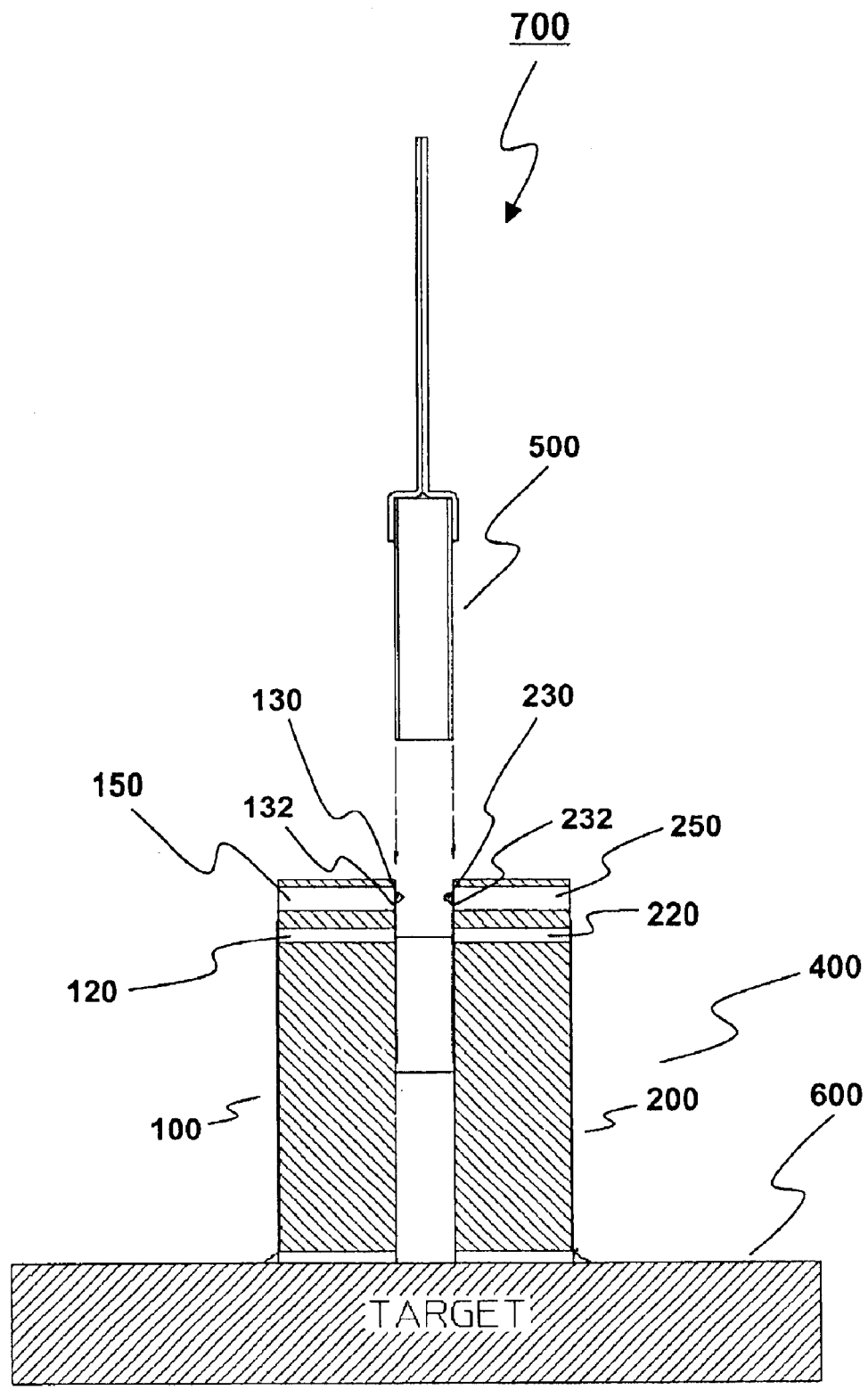
FIG. 13 is a section view of the cam connection system in accordance with certain embodiments of the invention.

Referring to FIGS. 12 and 13, perspective and section views, respectively, of a cam connection system in accordance with certain embodiments of the invention are shown. The cam connection system 700 has an interconnect 500, a connector 400, and a target board 600 as shown. The plurality of vias, 120 and 220, and plurality of bumpletts, 130 and 230, of the substantially planar first 100 and second 200 boards are visible in FIG. 13. Insertion of the interconnect 500 into the cavity of the connector 400 produces a camming force between the connector 400 and the interconnect 500, due to the presence of one or more plurality of bumpletts 230 and 130 on the connector. After insertion the interconnect 500 on the bumpletts 130 and 230 on the connector 400 is coupled to a corresponding plurality of traces located on the interconnect 500. The insertion causes bumpletts 130 and 230 to be pushed back against membranes 132 and 232, respectively, into cavities 150 and 250, respectively, thereby producing a camming force operable to encourage retention of interconnect 500 inside the connector 400. Optionally, the plurality of bumpletts may be configured on one or more of the connector 400 or the interconnect 500.

Figure 14:
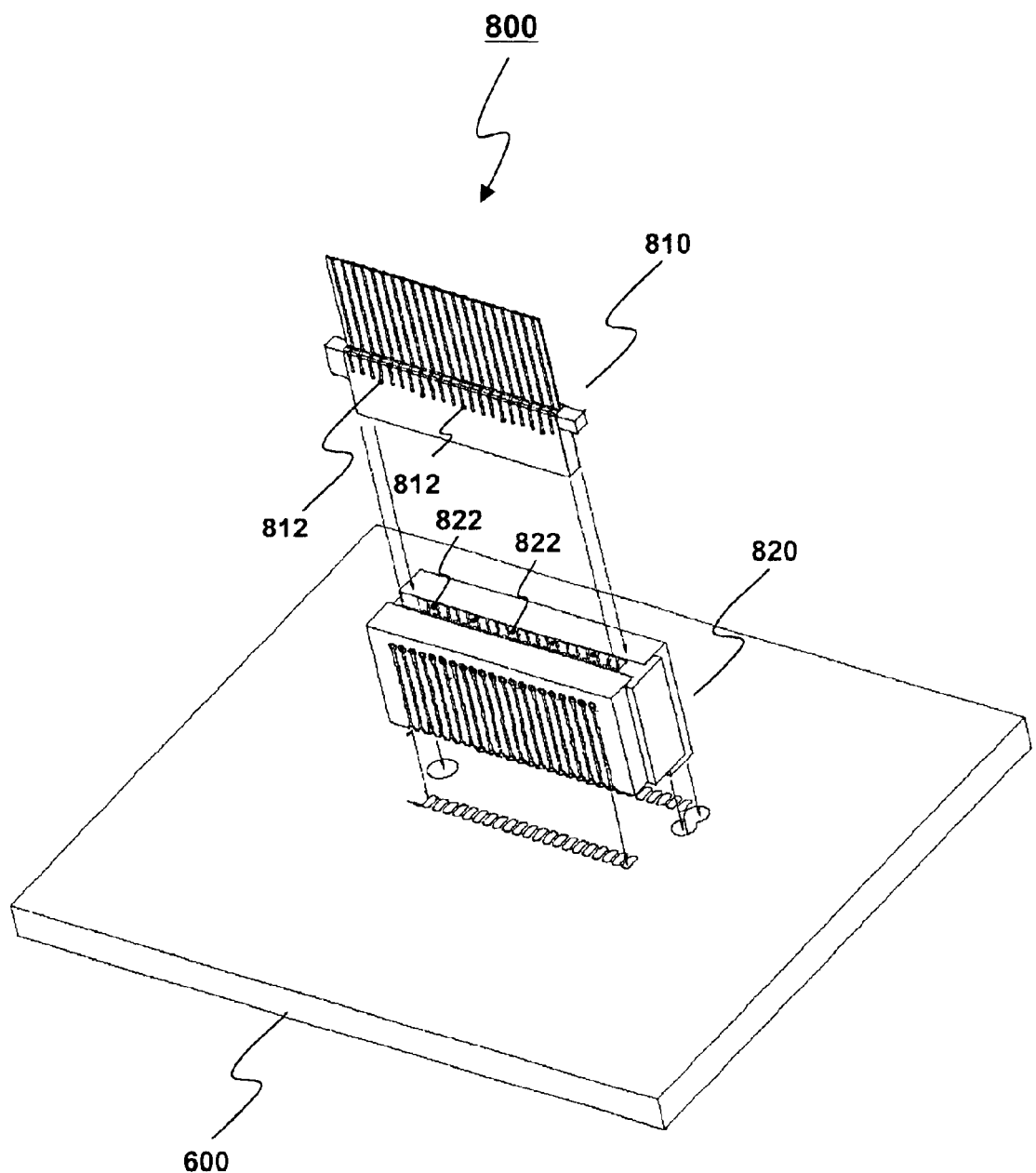
FIG. 14 is a perspective view of a cam connection system in accordance with certain embodiments of the invention.

Referring to FIG. 14, a perspective view of a cam connection system in accordance with an alternate embodiment of the present invention is shown. The cam connection system 800 has an interconnect 810, a connector 820, and a target board 600 as shown. In this configuration, the interconnect 810 and connector 820 both contain a plurality of bumpletts 812 and 822, respectively. As previously discussed, the bumpletts may be arranged as needed between the interconnect and the connector.

Figure 15:
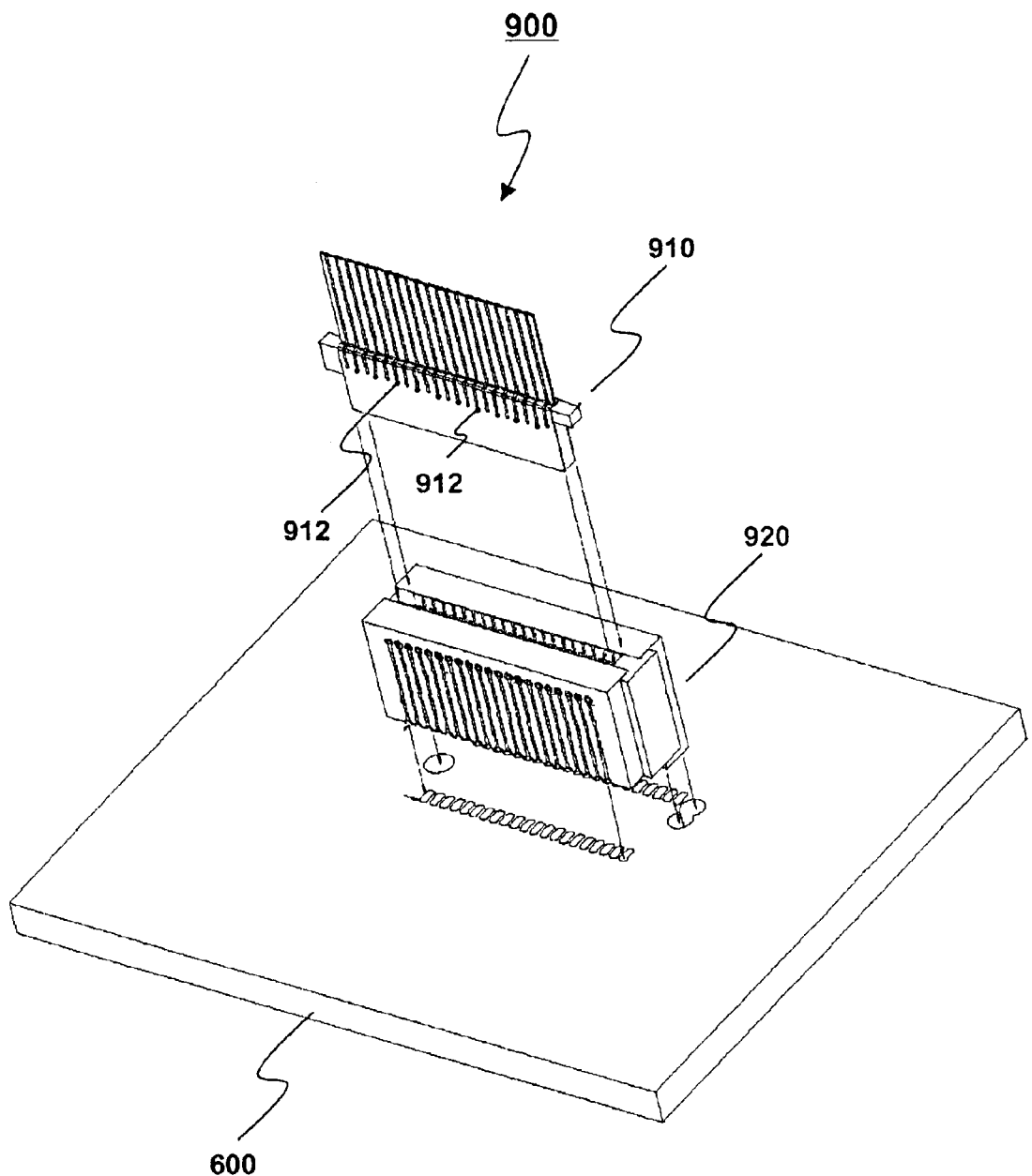
FIG. 15 is a perspective view of a cam connection system in accordance with certain embodiments of the invention.

Referring to FIG. 15, a perspective view of a cam connection system in accordance with an alternate embodiment of the present invention is shown. The cam connection system 900 has an interconnect 910, a connector 920, and a target board 600 as shown. In this configuration, the interconnect 910 contains a plurality of bumpletts 912 and the connector 920 does not contain any bumpletts. Insertion of the interconnect 910 into the cavity of the connector 920 produces a camming force between the connector 920 and the interconnect 910, due to the presence of one or more bumpletts 912 on the interconnect, shown on FIG. 16. After insertion the plurality of bumpletts 912 on the interconnect 910 is coupled to a corresponding plurality of traces located on the connector 920. The insertion causes bumpletts 912 to be pushed back against a membrane 914 into a cavity 916, thereby producing a camming force operable to encourage retention of interconnect 910 inside the connector 920. Optionally, the plurality of bumpletts may be configured on one or more of the connector 910 or the interconnect 920.

Figure 16:
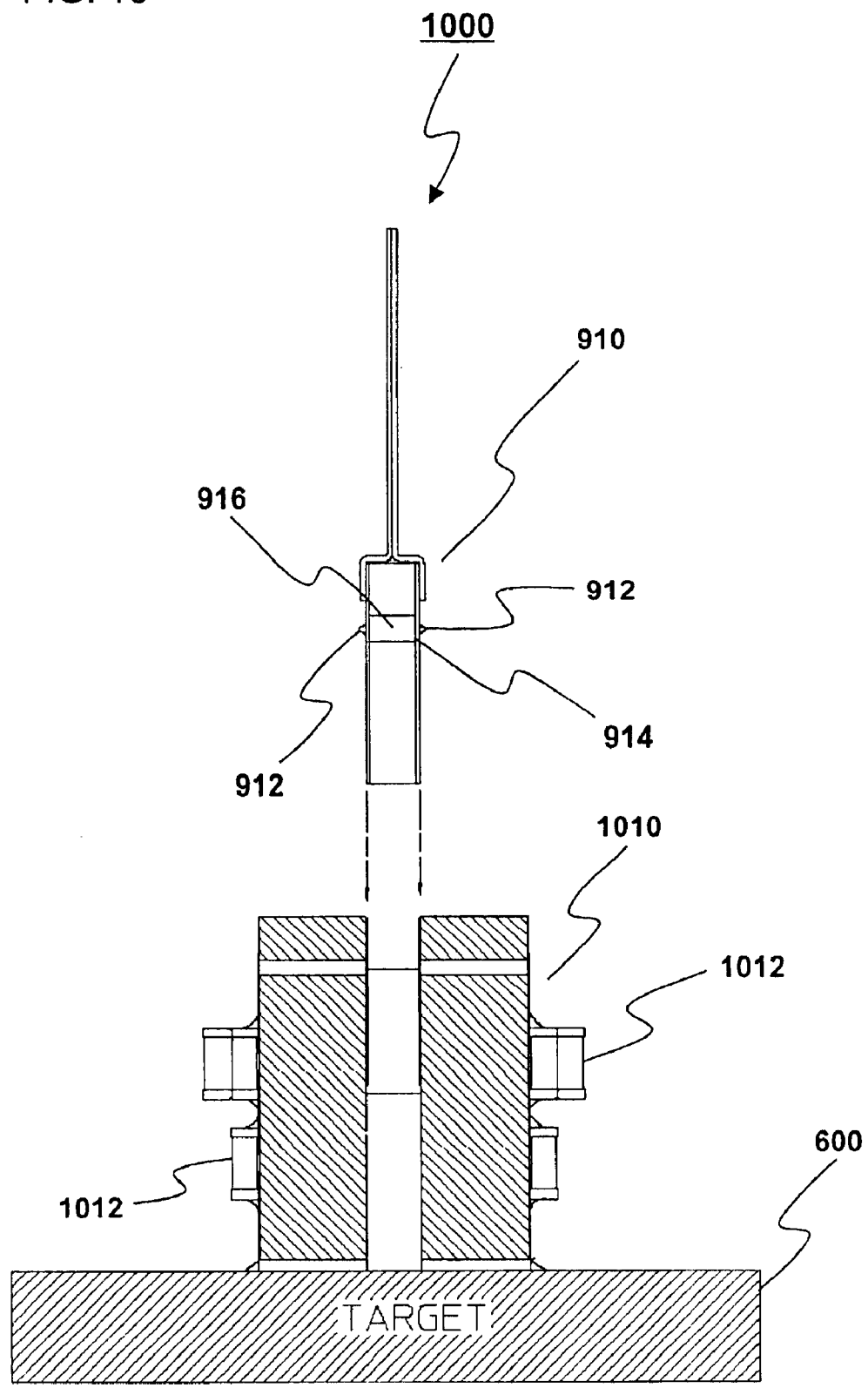
FIG. 16 is a section view of the cam connection system in accordance with certain embodiments of the invention, showing a termination network coupled to the connector.
Figure 17:
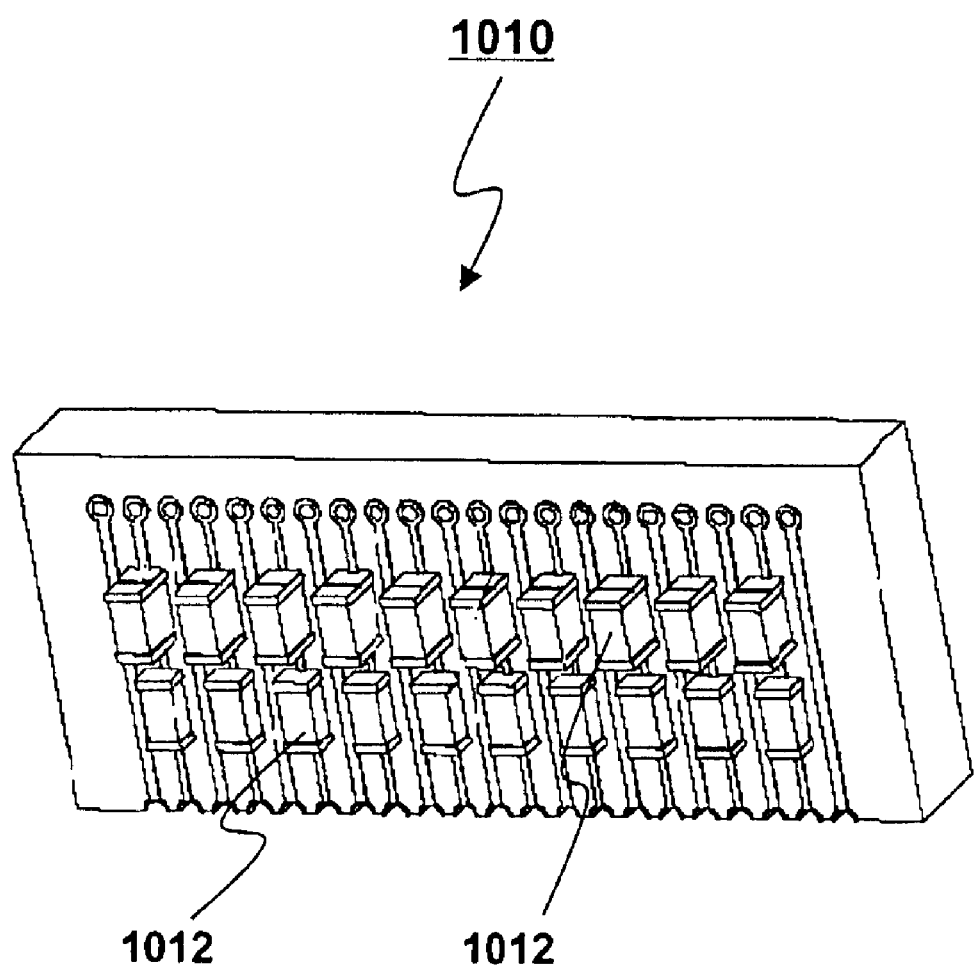
FIG. 17 is a perspective outside view of a substantially planar board in accordance with certain embodiments of the invention, showing a termination network coupled to the connector.
Figure 18:
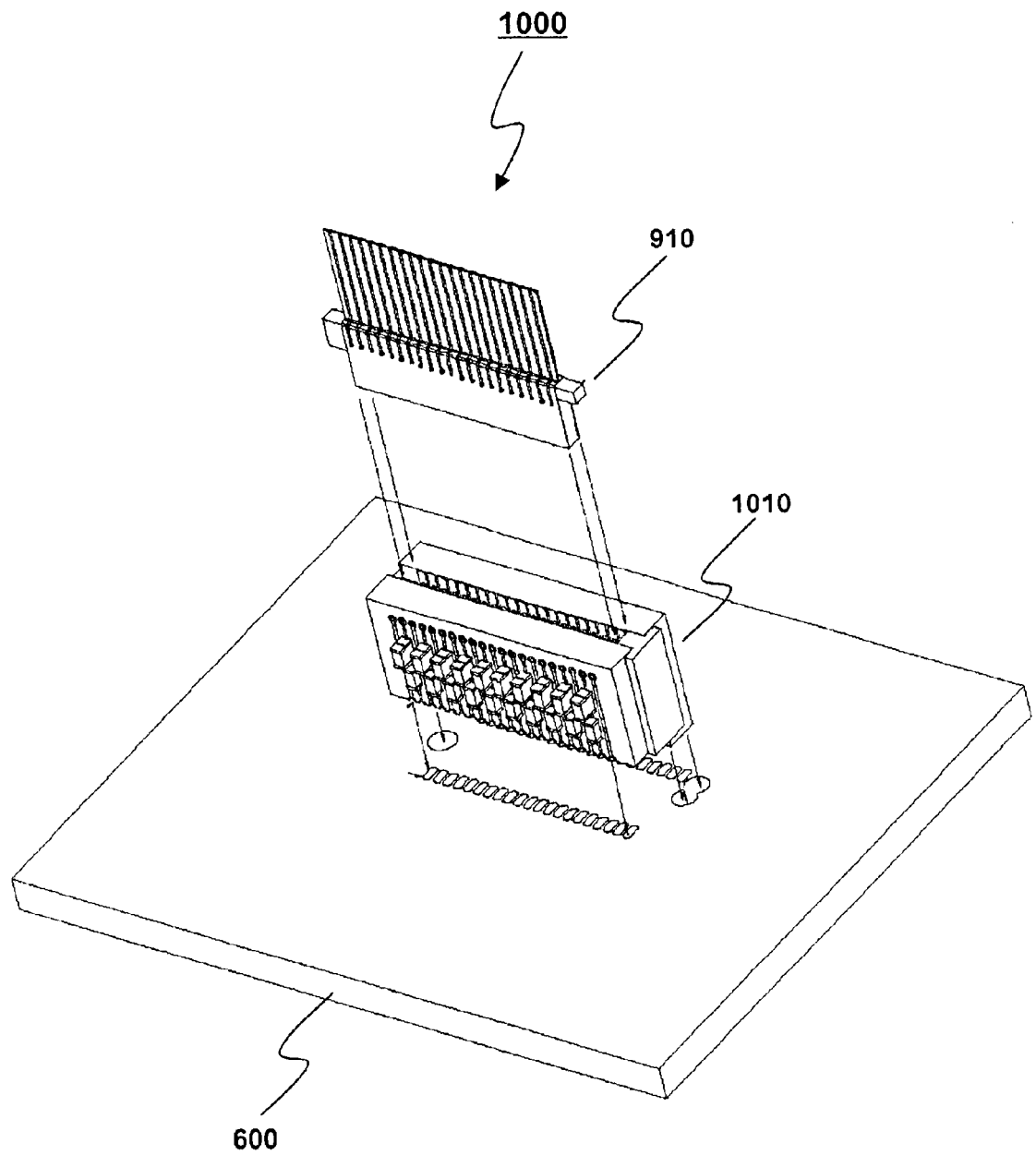
FIG. 18 is a perspective view of a cam connection in accordance with certain embodiments of the invention.

Referring to FIG. 16, a perspective view of a cam connection system in accordance with an alternate embodiment of the present invention is shown. The cam connection system 1000 has an interconnect 910, a connector 1010, and a target board 600 as shown. In this configuration, one or both of the first and second boards of the connector 1010 may contain an electrical circuit or components 1012, such as that which may be suitable for a termination network to minimize reflections between the target board 600 and the interconnect 910. FIG. 17, a perspective outside view of a substantially planar board in accordance with an alternate embodiment of the present invention shows a closer view of electrical circuit or components 1012. In this example, discrete electrical components, such as a stacked resistor-capacitor combination and a resistor, are placed on electrical traces that alternate with ground traces as shown. While such a configuration of discrete electrical components may be used to define one or more termination networks to reduce reflections at the interface, the invention is not limited to such a configuration as other configurations may additionally be used. In FIG. 18, a perspective view of a cam connection system in accordance with an alternate embodiment of the present invention shows a perspective view of the electrical circuit 1012 relative to the cam connection system.

Figure 19:
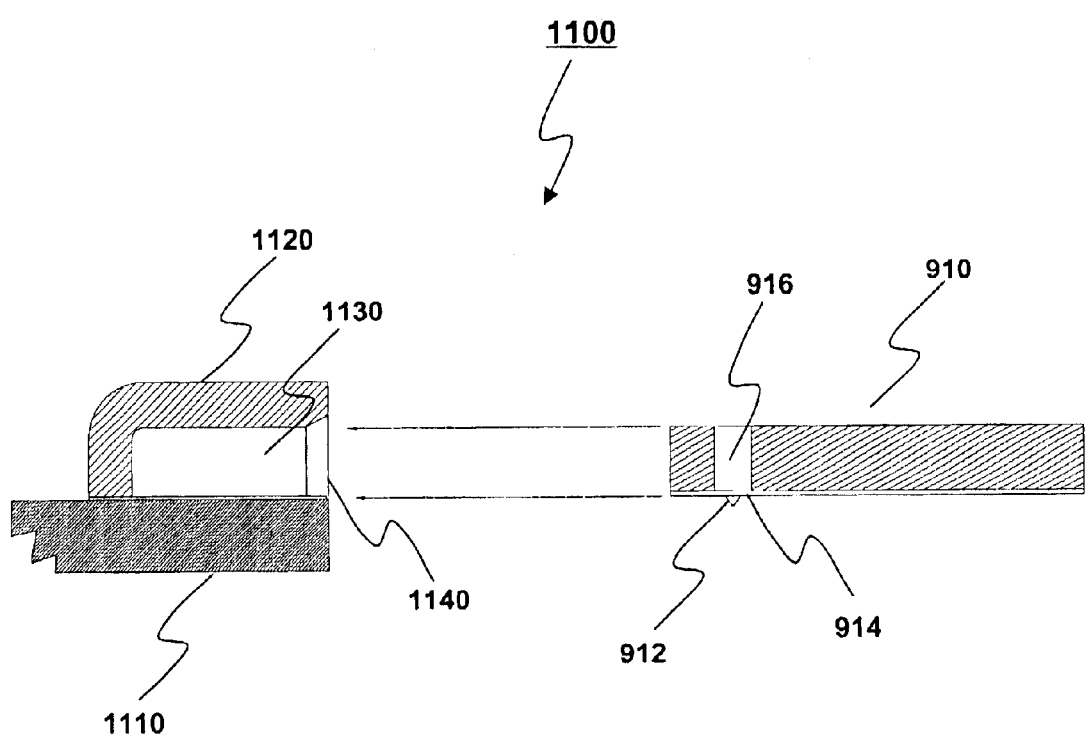
FIG. 19 is a section view of a cam connection system in accordance with certain embodiments of the invention.
Figure 20:
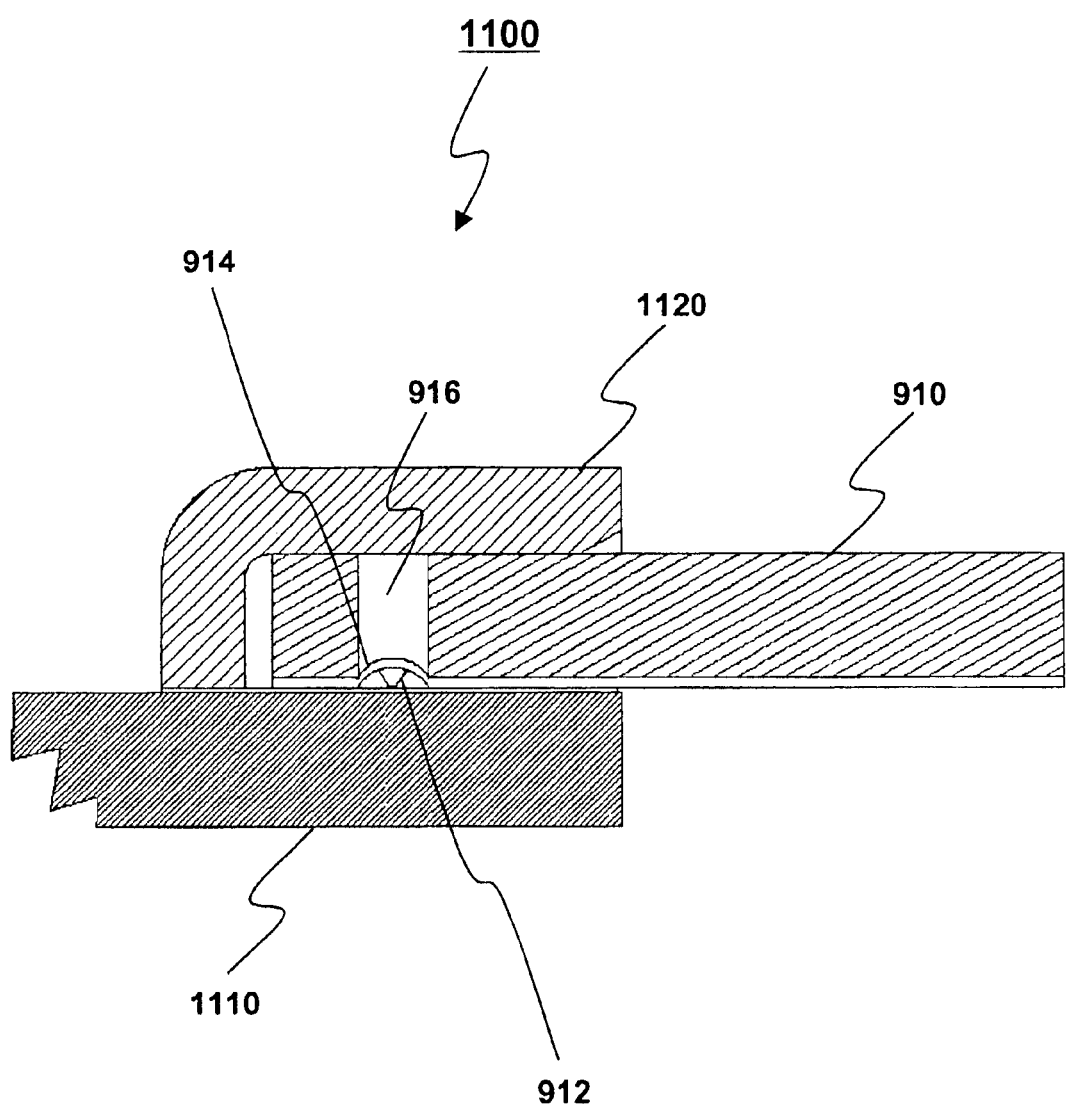
FIG. 20 is a section view of the cam connection system in accordance with certain embodiments of the invention.

Referring to FIGS. 19 and 20, a series of section views of a cam connection system in accordance with an alternate embodiment of the present invention is shown. The cam connection system 1100 has an interconnect 910, a target board 1110, and a connector housing 1120 as shown. In this configuration, the connector housing 1120 is coupled to the target board 1110 in such a manner as to accommodate insertion of interconnect 910 into cavity 1130 in a plane that is substantially parallel target board 1110. Insertion of the interconnect 910 into the cavity 1130 of the connector housing 1120 produces a camming force between the connector housing 1120, the target board 1110, and the interconnect 910, due to the presence of one or more bumpletts 912 on the interconnect. After insertion the plurality of bumpletts 912 on the interconnect 910 is directly coupled to a corresponding plurality of traces located on the target board 1110. The insertion causes bumpletts 912 to be pushed back against membrane 914 into cavity 916, thereby producing a camming force operable to encourage retention of interconnect 910 inside connector housing 1120. Optionally, the plurality of bumpletts may be configured on one or more of the target board 1110, the cam connection housing 1120, or on other locations of the interconnect 910.

Figure 21:
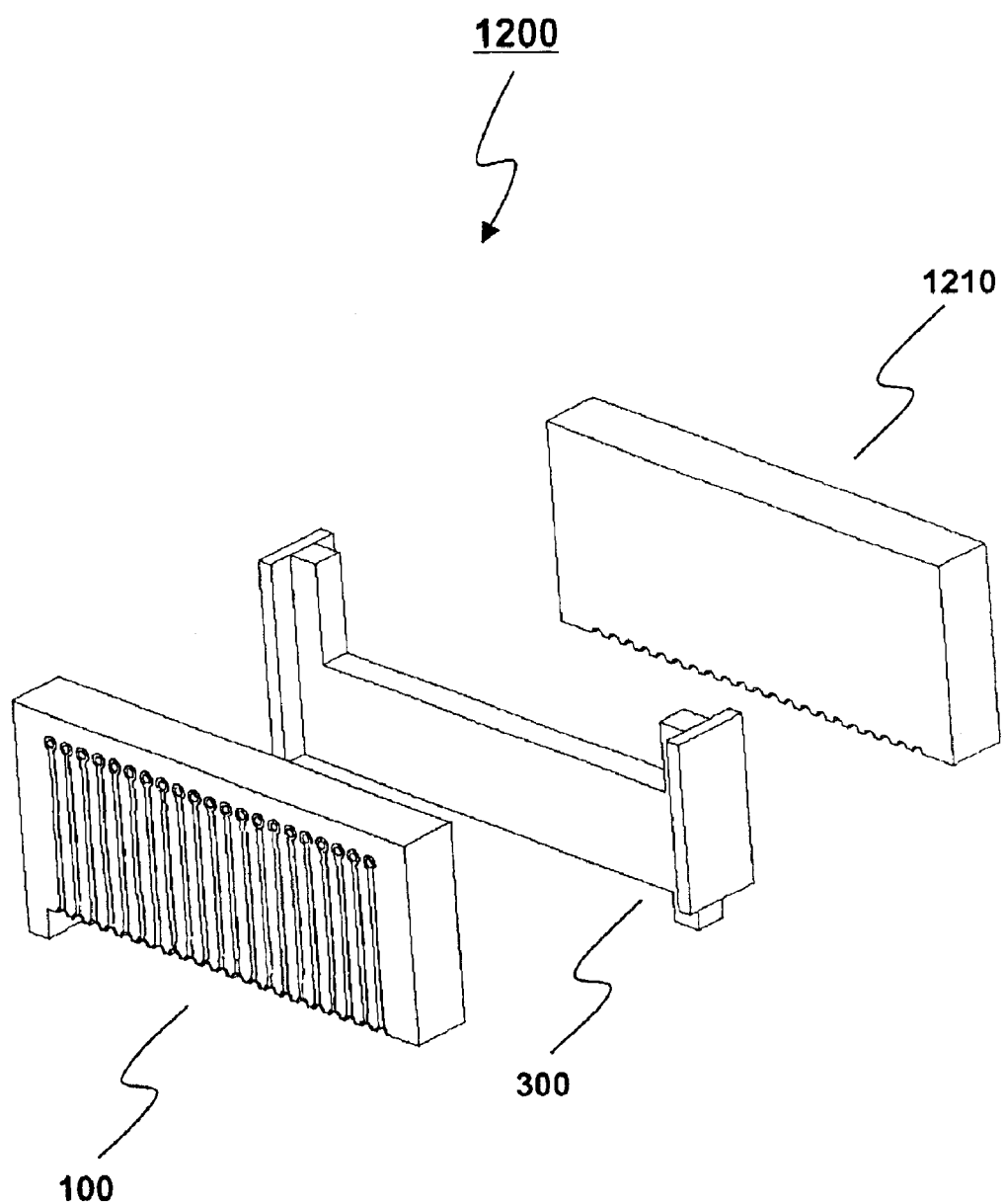
FIG. 21 is an exploded view of the cam connection system in accordance with certain embodiments of the invention.

Referring to FIG. 21, an exploded view of a connector in accordance with an alternate embodiment of the present invention is shown. In this configuration, it is demonstrated that one or more of the first and second boards that make up the connector may contain no electrical traces or electrical circuitry, as illustrated by board 1210 This does not interfere with the camming force produced by bumpletts when an interconnect is inserted into the connector.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A connector, comprising:
   a nest spacer element having a first substantially planar surface, a second substantially planar surface, and a recessed portion contiguous said first and second substantially planar surfaces operable to accommodate an interconnect;
   a substantially planar first board having a first outer surface and a first inner surface coupled to the first substantially planar surface of said nest spacer element;
   a substantially planar second board having a second outer surface and a second inner surface coupled to the second substantially planar surface of said nest spacer element, with at least one of said first and second boards having a plurality of connector signal traces arranged along one or more of corresponding said inner and outer surfaces; and
   a plurality of bumpletts located on one of more of said first board and said second board;
   wherein insertion of the interconnect into said recessed portion of said nest spacer element produces a camming force between the connector and the interconnect caused by said plurality of bumpletts acting on the interconnect.

2. The connector of claim 1, wherein the at least one said first and second boards having the plurality of connector signal traces is a printed circuit board having a plurality of electrical circuits.

3. The connector of claim 2, wherein the plurality of electrical circuits comprise a termination network.

4. The connector of claim 1, wherein the said first and second boards are printed circuit boards having a plurality of electrical circuits.

5. The connector of claim 4, wherein the plurality of electrical circuits comprise a termination network.

6. The connector of claim 1, wherein the camming force is operable to encourage retention of the interconnect in said connector.

7. The connector of claim 1, wherein the plurality of bumpletts are located on only one of said first and second boards.

8. The connector of claim 1, wherein the plurality of bumpletts are located on said first and second boards.

9. The connector of claim 1, wherein the plurality of connector signal traces are coupled to a plurality of target signal traces of a target board to which the connector is coupled.

10. The connector of claim 1, wherein at least one of said first and second boards has a keying element to key coupling of the connector to a target board.

11. A connector system, comprising:
    an interconnect having a substantially planar surface and a plurality of interconnect signal traces that terminate at a coupling end of said interconnect;
    a connector, comprising:
       a nest spacer element having a first substantially planar surface, a second substantially planar surface, and a recessed portion contiguous said first and second substantially planar surfaces operable to accommodate said interconnect;
       a substantially planar first board having a first outer surface and a first inner surface coupled to the first substantially planar surface of said nest spacer element; and
       a substantially planar second board having a second outer surface and a second inner surface coupled to the second substantially planar surface of said nest spacer element, with at least one of said first and second boards having a plurality of connector signal traces arranged along one or more of corresponding said inner and outer surfaces; and
    a plurality of bumpletts located on at least one of said interconnect, said first board, and said second board;
    wherein upon insertion of the coupling end of said interconnect into said recessed portion of said nest spacer element a camming force between the connector and the interconnect is produced.

12. The system of claim 11, wherein the at least one said first and second boards having the plurality of connector signal traces is a printed circuit board having a plurality of electrical circuits.

13. The system of claim 11, wherein the said first and second boards are printed circuit boards having a plurality of electrical circuits.

14. The system of claim 11, wherein the plurality of bumpletts are located on the interconnect.

15. The system of claim 11, wherein the plurality of bumpletts are located on one of said first and second boards.

16. The system of claim 15, wherein the plurality of bumpletts are located on said interconnect.

17. The system of claim 11, wherein the plurality of bumpletts are located on said first and second boards.

18. The system of claim 17, wherein the plurality of bumpletts are located on said interconnect.

19. The system of claim 11, wherein the plurality of connector signal traces are coupled to a plurality of target signal traces of a target board to which the connector is coupled.

20. The system of claim 11, wherein at least one of said first and second boards has a keying element to key coupling of the connector to a target board.

21. The system of claim 20, wherein said spacer nest element has a keying element to key coupling of the connector to a target board.

22. The system of claim 11, wherein said nest spacer element has a keying element to key coupling of the connector to a target board.

23. A cam connection system, comprising:
  an interconnect having a substantially planar surface and a plurality of interconnect signal traces that terminate at a coupling end of said interconnect;
  a connector, comprising:
    a nest spacer element having a first substantially planar surface, a second substantially planar surface, and a recessed portion contiguous said first and second substantially planar surfaces operable to accommodate said interconnect;
    a substantially planar first board having a first outer surface and a first inner surface coupled to the first substantially planar surface of said nest spacer element; and
    a substantially planar second board having a second outer surface and a second inner surface coupled to the second substantially planar surface of said nest spacer element, with at least one of said first and second boards having a plurality of connector signal traces arranged along one or more of corresponding said inner and outer surfaces;
  a target board having a plurality of target signal traces coupled to the plurality of connector signal traces of said connector; and
  a plurality of bumpletts located on at least one of said interconnect, said first board, and said second board;
  wherein upon insertion of the coupling end of said interconnect into said recessed portion of said nest spacer element a camming force between the connector and the interconnect is produced.

24. The system of claim 23, wherein the plurality of bumpletts are located on the interconnect.

25. The system of claim 23, wherein the plurality of bumpletts are located on one of said first and second boards.

26. The system of claim 25, wherein the plurality of bumpletts are located on said interconnect.

27. The system of claim 23, wherein the plurality of bumpletts are located on said first and second boards.

28. The system of claim 27, wherein the plurality of bumpletts are located on said interconnect.

29. The system of claim 23, wherein the plurality of connector signal traces are coupled to the plurality of target signal traces of the target board to which the connector is coupled.

30. The system of claim 23, wherein at least one of said first and second boards has a keying element to key coupling of the connector to a target board.

31. The system of claim 23, wherein said spacer nest element has a keying element to key coupling of the connector to a target board.

32. The system of claim 23, wherein said connector is soldered to the target board.

33. The system of claim 23, wherein the plurality of connector signal traces are located on the inner and outer surfaces of one or more of said first and second boards and wherein a plurality of vias couple the plurality of connector signal traces of the inner and outer surfaces.

34. The system of claim 23, wherein the nest spacer element further comprises a first and a second peripheral wall, wherein the first peripheral wall is coupled perpendicularly and coextensively to the first substantially planar surface and the second peripheral wall is coupled perpendicularly and coextensively to the second substantially planar surface operable to accommodate and secure said first and second boards.

35. The system of claim 23, wherein said plurality of bumpletts at least one of said interconnect, said first board, and said second board upon insertion of the coupling end of said interconnect into said recessed portion of said nest spacer element causes a wiping action that cleans said one or more of said plurality of connector signal traces and plurality of interconnect signal traces.

36. A cam connection system, comprising:
  an interconnect having a plurality of interconnect signal traces that terminate at a coupling end of said interconnect;
  a target board having a plurality of target signal traces;
  a connector housing coupled to said target board and having a portion operable to accommodate said interconnect parallel to said target board; and
  a plurality of bumpletts located on at least one of said interconnect, said connector housing, and said target boards;
  wherein upon insertion of the coupling end of said interconnect into said connector housing a camming force between the connector housing, the target board, and the interconnect is produced and said plurality of target signal traces are coupled to the plurality of interconnect signal traces.

37. The system of claim 36, wherein the connector housing further comprises a plurality of connector signal traces and said plurality of target signal traces are coupled to the plurality of interconnect signal traces by means of said plurality of connector signal traces.

* * * * *